United States Patent
Merchant

[11] Patent Number: 6,150,200
[45] Date of Patent: Nov. 21, 2000

[54] SEMICONDUCTOR DEVICE AND METHOD OF MAKING

[75] Inventor: Steven L. Merchant, Phoenix, Ariz.

[73] Assignee: Motorola, Inc., Schaumburg, Ill.

[21] Appl. No.: 09/055,119

[22] Filed: Apr. 3, 1998

[51] Int. Cl.[7] .................. H01L 21/332; H01L 21/8222
[52] U.S. Cl. ................. 438/133; 438/140; 438/340; 438/372; 438/374
[58] Field of Search .................................. 257/197, 336, 257/339, 342, 343, 335, 487, 493, 552, 565; 438/374, 316, 320, 341, 357, 133, 140, 369, 372

[56] References Cited

U.S. PATENT DOCUMENTS

| | | | |
|---|---|---|---|
| 4,290,077 | 9/1981 | Ronen | 257/339 |
| 5,369,041 | 11/1994 | Duvvury | 438/133 |
| 5,430,316 | 7/1995 | Contiero et al. | 257/335 |
| 5,485,027 | 1/1996 | Williams et al. | 257/343 |
| 5,517,046 | 5/1996 | Hsing et al. | 257/336 |
| 5,689,128 | 11/1997 | Hshieh et al. | 257/329 |
| 5,777,362 | 7/1998 | Pearce | 257/335 |

FOREIGN PATENT DOCUMENTS

| | | | |
|---|---|---|---|
| 2-288353 | 11/1990 | Japan | 438/340 |
| 9707547 | 2/1997 | WIPO . | |
| 9733315 | 9/1997 | WIPO . | |

*Primary Examiner*—Wael Fahmy
*Assistant Examiner*—William David Coleman
*Attorney, Agent, or Firm*—Daniel R. Collopy; Robert F. Hightower

[57] ABSTRACT

A semiconductor device (10) is formed in a semiconductor substrate (11) and an epitaxial layer (14). The semiconductor device includes a p-type body region (16), a source region (17), a channel region (19), and a drain region (34) formed in the epitaxial layer (14). A doped region (13) is formed in the semiconductor substrate (11) to reduce the drift resistance of the semiconductor device (10). The drain region (34) is formed from a plurality of doped regions (30–33) that can be formed with high energy implants.

7 Claims, 3 Drawing Sheets

SEMICONDUCTOR DEVICE AND METHOD OF MAKING

BACKGROUND OF THE INVENTION

This invention relates, in general, to semiconductor devices, and more particularly, to transistors having high breakdown voltage and low "on" resistance.

The design and fabrication of semiconductor devices involves the balancing of various electrical parameters to provide a device that meets the requirements of a particular customer. With power transistors, two of the most important electrical parameters are breakdown voltage and "on" resistance. Breakdown voltage (BV) generally refers to the maximum voltage that can be placed between the source and drain of a transistor while the transistor is in an "off" or non-conducting state (i.e., the voltage on the gate is less than the threshold voltage of the device). "On" resistance, also referred to as $R_{ds}$ on, is the resistance measurement between the drain and source terminals of a transistor when the transistor is in a conductive state (i.e., the voltage on the gate is equal to or greater than the threshold voltage of the device).

Historically, to increase the breakdown voltage of a lateral power transistor, the amount of dopant between the source and drain regions near the surface of the substrate is reduced. However, the reduction in dopant concentration results in an increase in the "on" resistance ($R_{ds}$ on) between the source and drain terminals. Conversely, with everything else being equal, improvements in $R_{ds}$ on typically result in a device that has a lower breakdown voltage.

Accordingly, a need exists to provide a semiconductor device that has either improved breakdown voltage or $R_{ds}$ on without compromising the other parameter.

Figure 1:
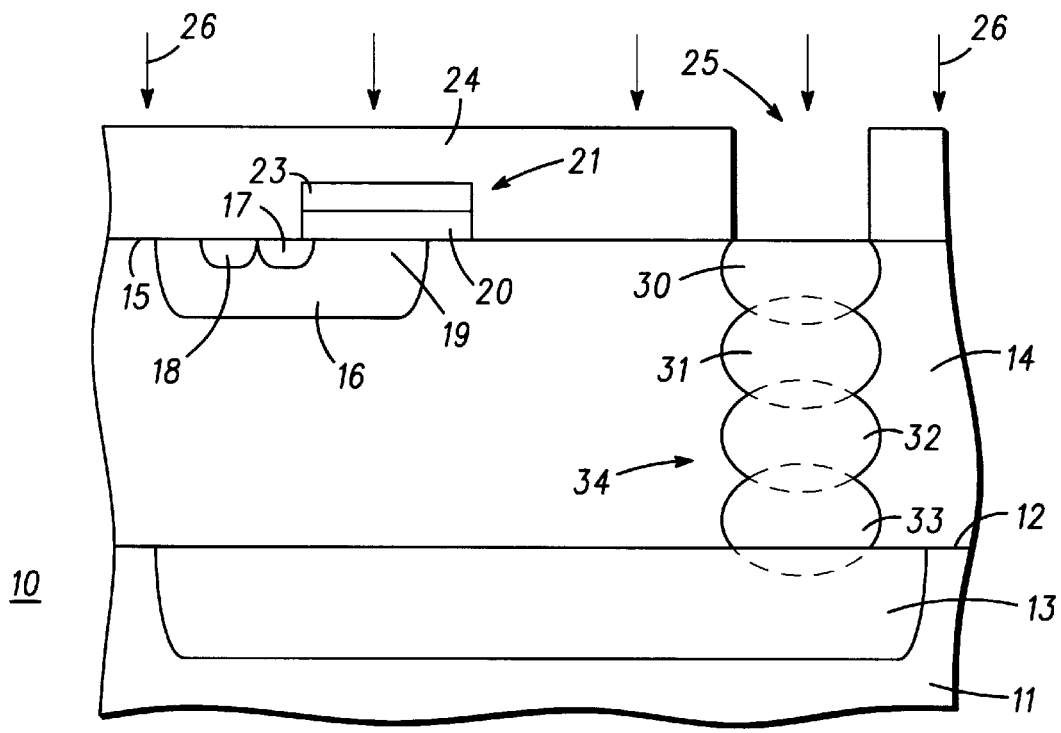
FIGS. 1–2 are enlarged cross-sectional views of a semiconductor device at various stages in a manufacturing process in accordance with an embodiment of the present invention.

It will be appreciated that for simplicity and clarity of illustration, elements illustrated in the figures have not necessarily been drawn to scale. For example, the dimensions of some of the elements are exaggerated relative to other elements for clarity. Further, where considered appropriate, reference numerals have been repeated among the figures to indicate corresponding or analogous elements.

DETAILED DESCRIPTION OF THE DRAWINGS

FIG. 1 is an enlarged cross-sectional view of a semiconductor device 10 at an early stage of a manufacturing process in accordance with the present invention. Semiconductor device 10 includes a doped region 34 and a buried doped region 13 that cooperate to reduce the "on" resistance ($R_{ds}$ on) of semiconductor device 10 while leaving the breakdown voltage relatively unaffected. In other words, the present invention provides, among other things, a methodology for improving either the $R_{ds}$ on or breakdown voltage of a semiconductor device without adversely affecting the other parameter. As shown in the example that follows, semiconductor device 10 is in an n-channel configuration. However, one skilled in the art will appreciate that a p-channel device can be formed by changing n-type regions to p-type regions and vice-versa.

The process for forming semiconductor device 10 in accordance with the example shown in FIG. 1 begins by providing a semiconductor substrate 11 that is preferably of p-type conductivity with a sheet rho ranging from about 0.001 ohm-centimeters (cm) to 1.0 ohm-cm. A buried doped region or a doped region 13 is then formed using a doping or ion implantation process. For example, a conventional photolithographic process is used to form an implantation mask (not shown) that exposes the portion of semiconductor substrate 11 that is to be implanted. Thereafter, an n-type dopant such as phosphorus or arsenic is implanted into the exposed portions of semiconductor substrate 11 with an energy ranging from about 50 keV to 150 keV and a dose ranging from about $1 \times 10^{15}$ atoms/centimeter$^2$ (cm$^2$) to $5 \times 10^{15}$ atoms/cm$^2$.

As shown in FIG. 1, doped region 13 extends from the substrate surface or the surface 12 of semiconductor substrate 11. However, it should be understood that the implant energy used to form doped region 13 could be increased so that doped region 13 is buried in semiconductor substrate 11 so as not to be in contact with surface 12. It should also be understood that the use of an ion implantation mask is optional as a blanket implant could be used to form doped region 13. Alternatively, doped region 13 could be formed by using n-type conductivity material to provide semiconductor substrate 11. Therefore, all of semiconductor substrate 11 would serve as doped region 13.

Thereafter, a layer of epitaxial silicon or an epitaxial layer 14 is grown on the surface 12 of semiconductor substrate 11. Preferably, epitaxial layer 14 is n-type with a doping concentration ranging from about $1 \times 10^{12}$ atoms/cm$^3$ to $1 \times 10^{15}$ atoms/cm$^3$. A conventional deposition process can be used to form epitaxial layer 14 so that epitaxial layer 14 has a thickness ranging from about 5,000 angstroms (Å) to 10 microns ($\mu$m). The thickness and doping concentration of epitaxial layer 14 can be varied with experimentation to adjust the breakdown voltage capability of semiconductor device 10. As shown in FIG. 1, epitaxial layer 14 is formed on the surface 12 of semiconductor substrate 11. However, it is also possible to form other layers (e.g., other epitaxial layers) between epitaxial layer 14 and semiconductor substrate 11 so that epitaxial layer 14 is overlying semiconductor substrate 11.

Additionally, in some applications the use of epitaxial layer 14 can be considered optional. In cost sensitive applications, epitaxial layer 14 can be replaced by forming an implanted region within semiconductor substrate 11. However, such a modification is not likely to appreciate all the advantages of the present invention.

A p-type body region 16 is then formed in epitaxial layer 14 by implanting epitaxial layer 14 with a p-type dopant such as boron. Preferably, p-type body region 16 extends from the epitaxial surface or surface 15 of epitaxial layer 14 and is positioned so that at least a portion of p-type body region 16 is overlying doped region 13. A source region 17 is then formed by implanting a portion of p-type body region 16 with an n-type dopant. As shown in FIG. 1, source region 17 is formed such that it is contained with p-type body region 16 so that a portion of p-type body region 16 physically and electrically isolates source region 17 from epitaxial layer 14. This portion of p-type body region 16 is hereinafter referred to as a channel region 19.

Optionally, a heavily doped p-type region 18 can be formed in p-type body region 16. Preferably, region 18 is formed so that it contacts source region 17 and fills p-type body region 16 with the exception of channel region 19. Doped region 18 is optionally used for two reasons. First, the additional dopant serves to reduce the contact resistance of the electrical contact that is subsequently made to source region 17. Secondly, doped region 18 shorts the base to the emitter of the parasitic bi-polar transistor that inherently exists with source region 17, p-type body region 16, and epitaxial layer 14, acting as the emitter, base, and collector regions, respectively.

Thereafter, a gate structure 21 is formed so gate structure 21 is overlying at least a portion of channel region 19. Preferably, gate structure 21 covers all of channel region 19 and overlaps portions of source region 17 and epitaxial layer 14 as shown in FIG. 1. Gate structure 21 can comprise a layer of dielectric material 20, such as silicon dioxide, and a conductive layer 23, such as polysilicon, amorphous silicon, silicide, or the like. It should be noted that the use of photolithographic, implantation, deposition, and etch processes to form, regions 16–18, gate structure 21, and epitaxial layer 14 are well known in the art. It should also be understood that gate structure 21 could be formed prior to the formation of p-type body region 16 and source region 17 so that the implantation steps would be self-aligned to gate structure 21.

A masking layer 24, such as a layer of photoresist, is then formed over the surface 15 of epitaxial layer 14. Masking layer 24 has an opening 25 that exposes the portion of epitaxial layer 14 where a drain region 34 is to be subsequently formed. Drain region 34 is formed so that it extends from the surface 15 of epitaxial layer 14 and contacts doped region 13. This is accomplished in the present invention by performing a plurality of implantation processes that form a plurality of doped regions 30–33 in epitaxial layer 14. For example, if epitaxial layer 14 is about 3 microns thick, then it may be desirable to form drain region 34 with four doped regions 30–33 as shown in FIG. 1. Accordingly, as the thickness of epitaxial layer 14 increases, additional doped regions may be necessary to form drain region 34. Conversely, as the thickness of epitaxial layer 14 is reduced, fewer doped regions may be necessary. The dashed portions of doped regions 30–33 are used to indicate the overlap between the various doped regions 30–33 to provide drain region 34.

In the preferred embodiment, each of doped regions 30–33 is formed by implanting epitaxial layer 14 through the opening 25 in masking layer 24 using high energy implants at various energies. Doped region 33 can be formed by implanting epitaxial layer 14 (indicted in FIG. 1 with arrows 26) with an n-type dopant such as phosphorus or arsenic at an energy ranging from about 2.5 MeV to 5 MeV and a dose ranging from about $1\times10^{13}$ atoms/centimeter$^2$ (cm$^2$) to $5\times10^{15}$ atoms/cm$^2$. Doped region 32 is then formed by implanting an n-type dopant at an energy ranging from about 1.5 MeV to 3 MeV and a dose ranging from about $1\times10^{13}$ atoms/cm$^2$ to $5\times10^{15}$ atoms/cm$^2$. Doped region 31 is then formed by implanting an n-type dopant at an energy ranging from about 0.5 MeV to 1 MeV and a dose ranging from about $1\times10^{13}$ atoms/cm$^2$ to $5\times10^{15}$ atoms/cm$^2$. Finally, doped region 30 is formed by implanting an n-type dopant at an energy ranging from about 100 keV to 1 MeV and a dose ranging from about $1\times10^{13}$ atoms/cm$^2$ to $5\times10^{15}$ atoms/cm$^2$.

Following the implantation sequence, masking layer 24 is removed and an anneal step is performed to activate the implanted dopant and to form drain region 34 with the doping profile shown in FIG. 1. For example, an anneal in an inert ambient at about 950° Celsius (C) to 1150° C. for about 30 seconds to 45 minutes can be used to activate the implanted dopant. It is also possible to omit the designated anneal step and rely on subsequent high temperature processing steps to achieve an equivalent effect.

Preferably, doped regions 30–33 are formed in the sequence described above using the same dopant species for each of doped regions 30–33. In addition, doped regions 30–33 are preferably formed after the formation of source region 17 and gate structure 21. However, it should be understood that drain region 34 could be formed prior to formation of the other elements shown in FIG. 1. It is also possible to form doped regions 30–33 in reverse or different order, and it is possible to use a different dopant species for each of doped regions 30–33.

Figure 2:
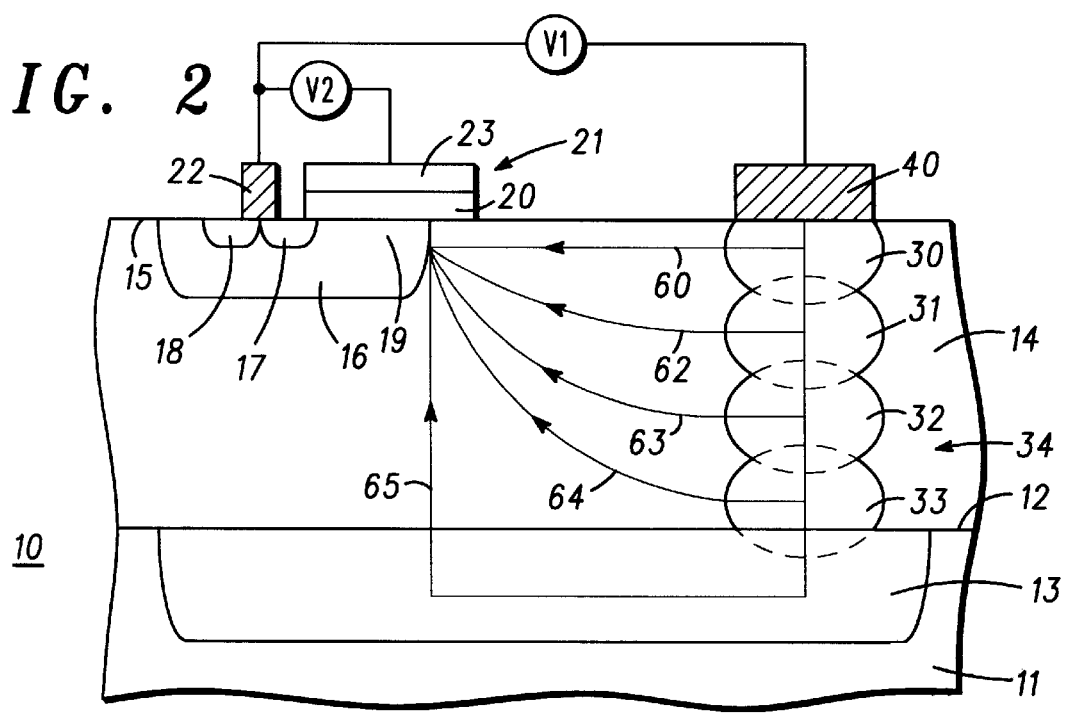

Turning now to FIG. 2, the process of forming semiconductor device 10 in accordance with the present invention is completed by forming a source contact 22 and a drain contact 40 using conventional metallization techniques known in the art. Source contact 22 is electrically connected to source region 17 and drain contact 40 is electrically connected to doped region 30, which in turn is connected to drain region 34.

An explanation is now provided as to how the formation of drain region 34 in accordance with the present invention reduces the "on" resistance ($R_{ds}$ on) of semiconductor device 10. To operate semiconductor device 10, a voltage potential (e.g., about 0.1 volts to 5 volts, indicated in FIG. 2 by V1) is placed between source region 17 and drain region 34 via source contact 22 and drain contact 40, respectively. An enabling voltage (e.g., about 3 volts to 20 volts, indicated in FIG. 2 by V2) is then placed between gate structure 21 and source region 17, thereby generating a response signal (i.e., a current flow). The enabling voltage is used to invert channel region 19 and transform semiconductor device 10 from a non-conducting to a conducting state. In the conductive state, a current flow passes between drain region 34 and source region 17 to provide a response signal.

Each of doped regions 30–33 provides a low resistance path for current to flow from drain contact 40 to p-type body region 16 when semiconductor device 10 is in a conducting state. The current path provided by each of doped regions 30–33 is indicated in FIG. 2 with arrows 60–64. In addition, the combination of drain region 34 and doped region 13 provides a low resistance path so that current can flow down drain region 34, across doped region 13, and then vertically to p-type body region 16. This current path is indicated in FIG. 2 with an arrow 65.

The formation of doped regions 13 and 30–33 reduce the drift resistance of semiconductor device 10 between drain contact 40 and p-type body region 16. In other words, drain region 34 and doped region 13 provide alternative path for the current flow that reduces the net resistance value between drain contact 40 and source contact 22. Simply stated, drain region 34 and doped region 13 provide an additional path for current that is substantially orthogonal to doped region 13 (arrow 65). This current path is in addition to the lateral or horizontal path that is substantially parallel to the surface 15 of epitaxial layer 14 (arrow 60). Even though the horizontal component is preferably greater than or equal to the vertical component, the current path provided by doped region 13 reduces the net drift resistance of semiconductor device 10. As a result, the "on" resistance or $R_{ds}$ on of semiconductor device 10 is appreciably reduced.

The amount of the reduction in $R_{ds}$ on can be significant compared to conventional lateral devices depending on the location and doping concentrations of drain region 34 and doped region 13. In many applications, the reduction in $R_{ds}$ on of semiconductor device 10 can exceed 25% versus conventional lateral power devices. Moreover, the presence of drain region 34 and doped region 13 does not adversely affect the breakdown voltage of semiconductor device 10. Thus, the present invention provides a structure that reduces the $R_{ds}$ on of a device, without compromising its breakdown voltage.

It should be understood that the advantages of the present invention could instead be used to increase the breakdown voltage of a device while maintaining the same $R_{ds}$ on value. This can be accomplished by forming the same structure shown as in FIG. 1, but by increasing the distance between drain region 34 and p-type body 16 and between p-type body region 16 and doped region 13. By increasing these distances, the breakdown voltage of semiconductor device 10 is increased. In conventional devices, this would also increase the $R_{ds}$ on of the device due to the longer current path from the drain terminal to the source terminal. However, the use of drain region 34 and doped region 13 in the present invention offsets for the longer current path and provides a device with a higher breakdown voltage, but the same $R_{ds}$ on value.

Figure 3:
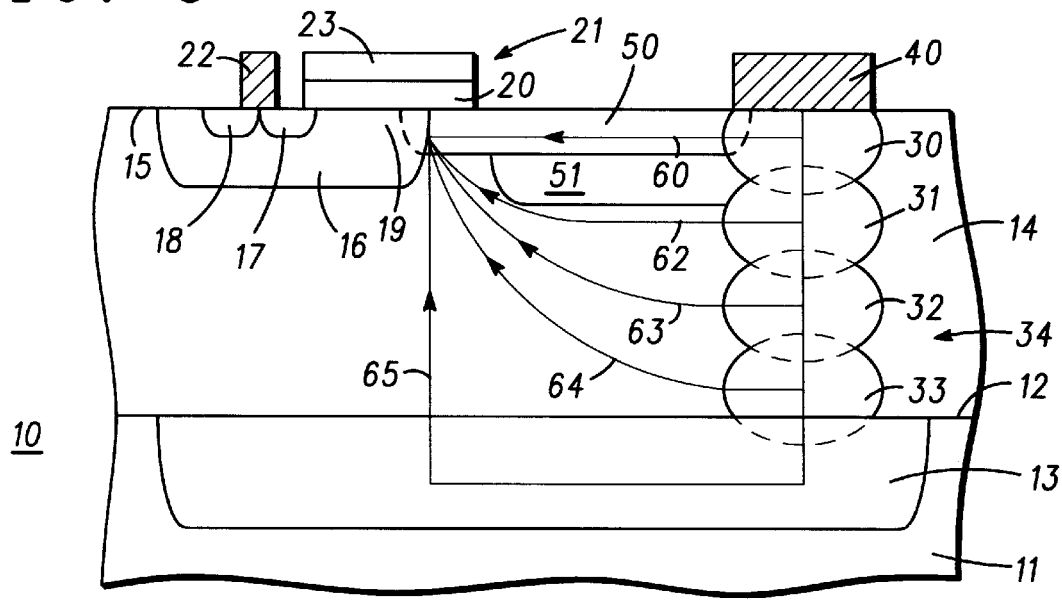
FIGS. 3–4 are enlarged cross-sectional views of a semiconductor device in accordance with an alternate embodiment of the present invention.

Referring now to FIG. 3, an alternative embodiment of the present invention is provided. The $R_{ds}$ on of semiconductor device 10 can be further reduced with the formation of reduced surface field (resurf) doped regions 50 and 51. For example, resurf doped region 50 can be formed by selectively implanting epitaxial layer 14 with an n-type dopant at an energy ranging from about 100 keV to 1.0 MeV and a dose ranging from about $1 \times 10^{11}$ atoms/cm to $2 \times 10^{14}$ atoms/cm$^2$. As shown in FIG. 3, resurf doped region 50 is preferably formed so that it contacts both p-type body region 16 and doped region 30. The amount of contact is indicated in FIG. 3 with dashed lines. However, it is possible to form resurf doped region 51 so that it is positioned between the drain region 34 and the p-type body region 16, and only contacts just one or none of the adjacent regions. It should be noted that the amount overlap between resurf doped region 50 and p-type body region 16 will directly reduce the breakdown voltage of semiconductor device 10.

Resurf doped region 51 can be formed by implanting a p-type dopant, such as boron, at an energy ranging from about 100 keV to 1 MeV and a dose ranging from about $1 \times 10^{11}$ atoms/cm$^2$ to $1 \times 10^{14}$ atoms/cm$^2$. Preferably, resurf doped region 51 is formed so that it is juxtaposed to resurf doped region 50 in the horizontal direction and in contact with drain region 34 as shown in FIG. 3. However, it is possible to form resurf doped region 50 so that it is positioned between the drain region 34 and the p-type body region 16, and only contacts just one or none of the adjacent regions.

Because resurf doped region 50 is of the same conductivity type as epitaxial layer 14, it further reduces the drift resistance between drain region 34 and p-type body region 16. However, the increase is doping concentration along the surface 15 of epitaxial layer 14 would normally reduce the breakdown voltage of semiconductor device 10. Therefore, the increase in n-type doping concentration is offset by the formation of resurf doped region 51 which is of p-type conductivity. Consequently, when semiconductor device 10 is in a non-conducting state, the p-type dopant in resurf doped region 51 depletes the n-type dopant in resurf doped region 50, and thus, the breakdown voltage of semiconductor device 10 is not affected. Therefore, to minimize the effect on the breakdown voltage of semiconductor device 10, the p-type dopant of resurf doped region 51 should be located in similar quantity and in close proximity to the n-type dopant of resurf doped region 50.

Figure 4:
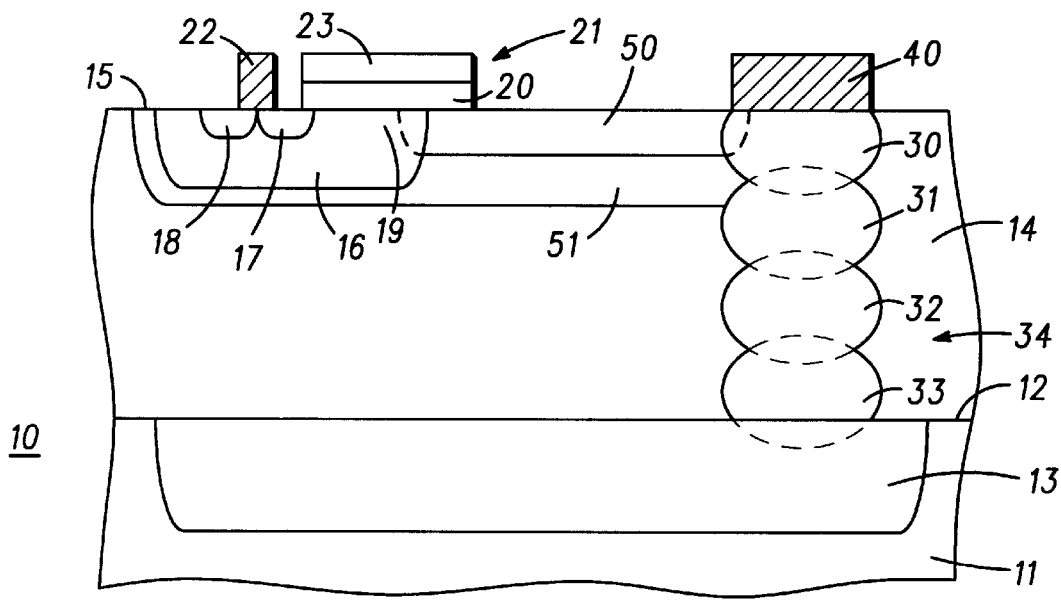
Figure 5:
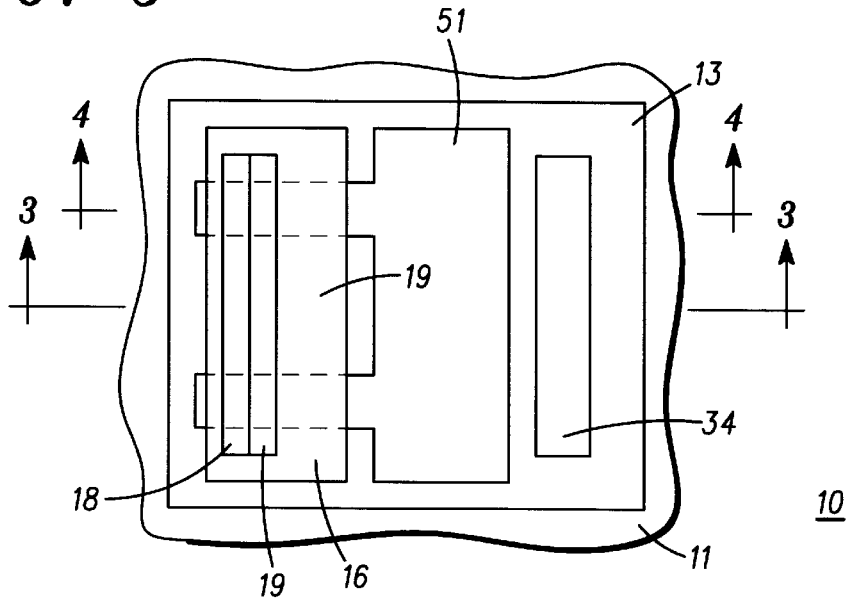
FIG. 5 is a top view of the semiconductor device in accordance with the alternate embodiment of the present invention.

To further minimize the parasitic effects of resurf doped region 51, it is preferred to have resurf doped region 51 contact p-type doped region 16 in locations where current does not flow between drain region 34 and p-type body region 16. To illustrate how this is accomplished, FIGS. 4 and 5 are referred to simultaneously. FIG. 5 is a top view of semiconductor device 10. Gate structure 21, source contact 22, and drain contact 40 are omitted from FIG. 5 for ease of understanding. Sectional lines 3—3 and 4—4 are used to indicate the location of the cross-sections shown in FIGS. 3 and 4, respectively. As shown in FIG. 4, some portions of resurf doped region 51 extend into and beyond p-type body region 16. In these regions, the presence of resurf doped region 51 near the intersection between p-type body region 16 and epitaxial layer 14 prevents the flow or current from drain region 34, but allows resurf doped region 51 and p-type body region 16 to be maintained at the same voltage potential. As shown in FIG. 3, current can flow from drain region 34 to p-type body region 16 where resurf doped region 51 does not contact p-type body region 16.

Figure 6:
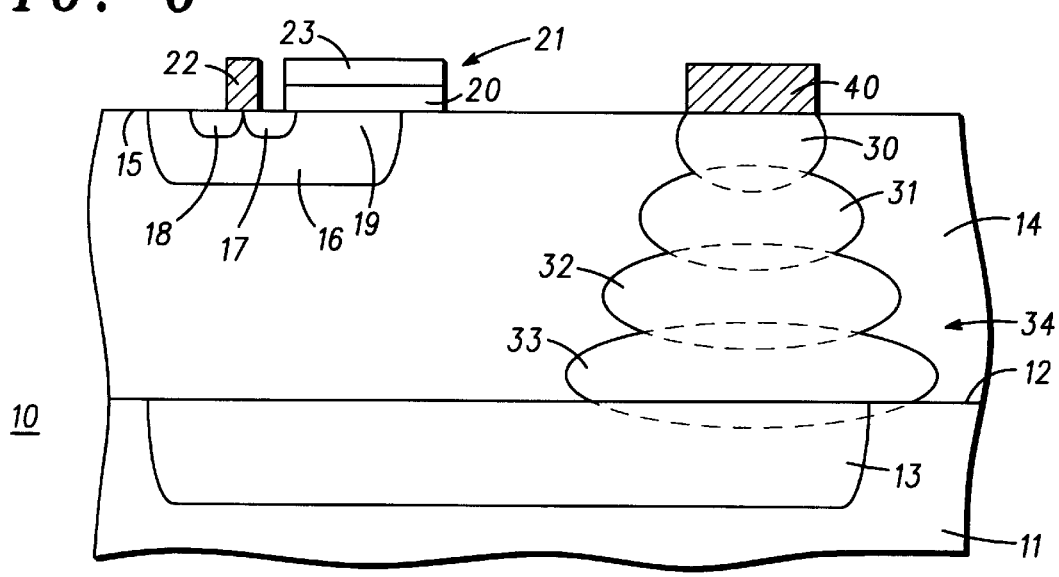
FIG. 6 is an enlarge cross-sectional view of a semiconductor device in accordance with yet another alternate embodiment of the present invention.

Referring now to FIG. 6, another alternative embodiment of the present invention is provided. As described above, doped regions 30–33 of drain region 34 serve to reduce the drift resistance between drain contact 40 and p-type body region 16. This can be further enhanced by altering the width of each of doped regions 30–33 as shown in FIG. 6. By increasing the width of each doped regions 30–33, the relative distance between p-type body region 16 and drain region 34 is shortened and the $R_{ds}$ on of semiconductor device 10 is further reduced. The structure shown in FIG. 6 can be achieved in a variety of methods. For example, instead of using a single masking layer as shown in FIG. 1 (masking layer 24), each of doped regions 30–33 can be formed by implanting through a different mask having a different width for opening 25. The profile shown in FIG. 6 may also be achieved by performing a similar process described above with reference to FIG. 1, but by performing an anneal step after each implantation step. To do this, masking layer 24 would have to be removed prior to each anneal, but at least the same photolithographic mask could be used each time to reform masking layer 24.

In addition, a doping profile similar to that shown in FIG. 6 can be formed by adjusting the angle of the implant relative to the surface 15 of epitaxial layer 14. The implant shown in FIG. 1 with arrows 26 was performed at a 0° angle (i.e., the direction of the ion is orthogonal to the surface 15 of epitaxial layer 14). Instead, the profile shown in FIG. 6 could be formed by adjusting the angle of the implant from about 3° to 14° relative to the surface 15 of epitaxial layer 14.

By now it should be appreciated that the present invention provides a variety of structures and methods for their fabrication. Devices formed in accordance with the present invention offer significantly reduced "on" resistance. In addition, the improvement in $R_{ds}$ on can be appreciated without reducing the breakdown voltage of the device. It should be understood that the examples shown in FIGS. 1–6 can be used to form a discrete power device, and that the structures shown in FIGS. 1–6 can represent the structure of a base cell that is repeated to form a semiconductor device that has higher current carrying capability. Preferably in such a configuration, drain region 34 provides the current to multiple source regions 17, and the current flowing out of each source region 17 is provided solely by one drain region 34.

It should also be understood that the teachings of the present invention can be incorporated with other semiconductor devices to provide a multi-functional integrated circuit such as a microcontroller.

What is claimed is:

1. A method of making a semiconductor device comprising the step of:

providing a semiconductor substrate having a substrate surface;

forming a first doped region in the semiconductor substrate, wherein the first doped region is of a first conductivity type;

forming a second doped region of a second conductivity type in the semiconductor substrate, wherein the second doped region extends from the substrate surface and is overlying at least a portion of the first doped region;

forming a source region of the first conductivity type in the second doped region, wherein the second doped region isolates the source region from the semiconductor substrate to provide a channel region;

forming a gate structure overlying at least a portion of the channel region; and performing a plurality of implantation processes to form a drain region of the first conductivity type that extends from the substrate surface and contacts the first doped region in the semiconductor substrate.

2. The method of claim 1 further comprising the steps of:

forming a third doped region of the first conductivity type in the semiconductor substrate, wherein the third doped region is positioned between the drain region and the second doped region; and forming a fourth doped region of the second conductivity type in the semiconductor substrate, wherein the fourth doped region is juxtaposed to the third doped region.

3. The method of claim 2 wherein the step of forming the third doped region includes forming the third doped region so that the third doped region contacts the drain region.

4. The method of claim 2 wherein the step of forming the third doped region includes forming the third doped region so that the third doped region contacts the second doped region.

5. The method of claim 2 wherein the step of forming the fourth doped region includes forming the fourth doped region so that a portion of the fourth doped region contacts the second doped region.

6. The method of claim 2 wherein the step of forming the fourth doped region includes forming the fourth doped region so that a portion of the fourth doped region contacts the drain region.

7. The method of claim 1 wherein the step of performing a plurality of implantation processes includes forming a plurality of doped regions that each have a width that is different.

* * * * *